US006886244B1

(12) United States Patent
McLeod et al.

(10) Patent No.: US 6,886,244 B1
(45) Date of Patent: May 3, 2005

(54) SEGMENTED PALLET FOR DISK-SHAPED SUBSTRATE ELECTRICAL BIASSING AND APPARATUS COMPRISING SAME

(75) Inventors: Paul Stephen McLeod, Berkeley, CA (US); Taesun Ernest Kim, San Jose, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 195 days.

(21) Appl. No.: 10/212,699

(22) Filed: Aug. 7, 2002

Related U.S. Application Data

(60) Provisional application No. 60/359,787, filed on Feb. 25, 2002.

(51) Int. Cl.[7] .............................................. H05K 3/20
(52) U.S. Cl. ........................... 29/831; 29/846; 29/759; 29/760; 29/742; 29/745; 361/760; 198/465.1
(58) Field of Search ......................... 29/831, 846, 760, 29/759, 742, 745, 746; 198/465.1–465.3, 198/803, 867.1–867.3, 867.15; 204/298.01; 218/145; 438/613, 615; 361/760, 749

(56) References Cited

U.S. PATENT DOCUMENTS

| | | | | |
|---|---|---|---|---|
| 3,878,553 A | * | 4/1975 | Sirles et al. ................. | 257/522 |
| 4,473,455 A | | 9/1984 | Dean et al. | |
| 4,595,481 A | | 6/1986 | Allen et al. | |
| 4,650,064 A | | 3/1987 | Slabaugh | |
| 4,749,465 A | | 6/1988 | Flint et al. | |
| 4,849,250 A | | 7/1989 | Dee et al. | |
| 5,186,417 A | * | 2/1993 | Pritchard ................. | 244/137.1 |
| 5,244,555 A | | 9/1993 | Allen et al. | |
| 5,394,206 A | * | 2/1995 | Cocca ......................... | 396/208 |
| 5,543,002 A | | 8/1996 | Brinda et al. | |
| 5,683,561 A | | 11/1997 | Hollars et al. | |
| 5,700,725 A | | 12/1997 | Hower et al. | |
| 5,748,523 A | * | 5/1998 | Thomas et al. ............. | 365/171 |
| 5,753,091 A | | 5/1998 | Weber et al. | |
| 5,762,766 A | | 6/1998 | Kurita et al. | |
| 5,891,311 A | | 4/1999 | Lewis et al. | |
| 5,907,477 A | * | 5/1999 | Tuttle et al. ................. | 361/760 |
| 5,933,752 A | * | 8/1999 | Yanagida ..................... | 438/613 |
| 5,938,902 A | | 8/1999 | Nguyen et al. | |
| 6,091,039 A | * | 7/2000 | Pham et al. ................. | 218/145 |
| 6,156,154 A | | 12/2000 | McLeod et al. | |
| 6,156,171 A | | 12/2000 | Hollars et al. | |
| 6,166,403 A | * | 12/2000 | Castagnetti et al. ........ | 257/211 |
| 6,290,821 B1 | | 9/2001 | McLeod | |

* cited by examiner

Primary Examiner—Carl J. Arbes
Assistant Examiner—Tai Nguyen
(74) Attorney, Agent, or Firm—McDermott Will & Emery LLP

(57) ABSTRACT

An apparatus for performing treatments to the surface of disk-shaped workpieces/substrates, as in the manufacture of multi-layer, thin-film recording media. The apparatus includes treatment stations for performing treatments to a surface of each of the disk-shaped workpieces/substrates; a pallet adapted for mounting the disk-shaped workpieces/substrates, a plurality of bias potential sources; and a transporting source to transport the pallet past the treatment stations. The pallet includes electrically conductive segments and each segment is electrically insulated from other segments; is adapted to mount and expose at lest one surface of a disk-shaped workpiece; and includes an electrical contact for providing electrical contact with the bias potential source of the apparatus.

21 Claims, 2 Drawing Sheets

SEGMENTED PALLET FOR DISK-SHAPED SUBSTRATE ELECTRICAL BIASSING AND APPARATUS COMPRISING SAME

CROSS-REFERENCE TO PROVISIONAL APPLICATION

This application claims priority from U.S. provisional patent application Ser. No. 60/359,787, filed Feb. 25, 2002, the entire disclosure of which is incorporated herein by reference.

FIELD OF THE INVENTION

The present invention relates to an apparatus and method for simultaneously applying different electrical bias potentials to a plurality of workpieces/substrates carried by a moving pallet past a plurality of treating stations. The invention has particular utility in the automated manufacture of magnetic or magneto-optical recording media comprising a multi-layer stack of thin film layers formed on an insulative substrate, e.g., a disk-shaped substrate, by means of a physical vapor deposition (PVD) process, e.g., sputtering.

BACKGROUND OF THE INVENTION

Magnetic and MO media are widely employed in various applications, particularly in the computer industry for data/information storage and retrieval purposes. A magnetic medium in e.g., disk form, such as utilized in computer-related applications, comprises a non-magnetic substrate, e.g., of glass, ceramic, glass-ceramic composite, polymer, metal, or metal alloy, typically an aluminum (Al)-based alloy such as aluminum-magnesium (Al—Mg), having at least one major surface on which a layer stack comprising a plurality of thin film layers constituting the medium are sequentially deposited. Such layers may include, in sequence from the workpiece (substrate) deposition surface, a plating layer, e.g., of amorphous nickel-phosphorus (Ni—P), a polycrystalline underlayer, typically of chromium (Cr) or a Cr-based alloy such as chromium-vanadium (Cr—V), a magnetic layer, e.g., of a cobalt (Co)-based alloy, and a protective overcoat layer, typically of a carbon-based material having good mechanical (i.e., tribological) properties. A similar situation exists with MO media, wherein a layer stack is formed which comprises a reflective layer, typically of a metal or metal alloy, one or more rare-earth thermo-magnetic (RE-TM) alloy layers, one or more dielectric layers, and a protective overcoat layer, for functioning as reflective, transparent, writing, writing assist, and read-out layers, etc.

According to conventional manufacturing methodology, a majority of the above-described layers constituting magnetic and/or MO recording media are deposited by cathode sputtering, typically by means of multi-cathode and/or multi-chamber sputtering apparatus wherein a separate cathode comprising a selected target material is provided for deposition of each component layer of the stack and the sputtering conditions are optimized for the particular component layer to be deposited. A plurality of cathodes each comprised of a selected target material for a particular layer can be positioned within a single or in respective process sub-chambers located within a larger chamber, or a single cathode may be provided in each of a plurality of separate, interconnected process chambers each dedicated for deposition of a particular layer. According to such conventional manufacturing technology, a plurality of media substrates, typically in disk form, are serially transported by means of a multi-apertured pallet or similar type holder, in linear or circular fashion, depending upon the physical configuration of the particular apparatus utilized, from one sputtering target and/or process chamber to another for sputter deposition of a selected layer thereon.

Cost-effective productivity requirements imposed by automated manufacturing technology for magnetic and MO media require maximized sputter deposition rates, while at the same time, high quality, high areal recording density media require high purity thin film layers which exhibit respective physical, chemical, and/or mechanical properties, including, inter alia, proper crystal morphology necessary for obtaining high areal recording densities, e.g., polycrystallinity; good magnetic properties, e.g., coercivity and squareness ratio; chemical stability, e.g., inertness or corrosion resistance; and good tribological properties, e.g., wear resistance and low stiction/friction. Frequently (but not necessarily), obtaining such desirable physical, chemical, and/or mechanical properties for each of the constituent layers of the multi-layer media requires application of an electrical bias potential to the substrate during sputtering, e.g., a DC, AC, or RF bias potential, or some combination thereof, wherein the bias type and level of bias potential is optimized for each constituent layer. For example, application of a suitable substrate bias during sputter deposition of metal-based underlayers and ferromagnetic metal alloy layers of thin film magnetic recording media can facilitate formation of preferred crystal orientations, and increase carbon (C) density of C-based protective overcoat layers of thin film magnetic and MO recording media.

Currently, application of optimum substrate bias to disk substrates for deposition thereon of particular films or layers poses no problem when processing is performed on a single-disk basis in separate chambers dedicated for deposition of the particular layers, e.g., as with the Intevac 250B and Unaxis M14 systems. However, when the films or layers are deposited in a more cost-effective manner at high product throughput onto closely-packed pluralities of disk substrates carried by a moving pallet, i.e., an elongated, electrically conductive pallet, application of optimum substrate bias for particular film or layer deposition thereon may be problematic. For example, and particularly where a plurality of different coating material sources, e.g., magnetron sputtering sources, are located in spaced adjacency within a single vacuum chamber of an in-line apparatus, application of different bias potentials to the moving pallet as the disks carried thereon pass by a particular cathode may be difficult, if not impossible, for the following reason: in such in-line apparatus, sliding electrical bias contactors are located on a single potential rail that contacts the bottom edge of the pallet as it passes through the chamber, maintaining the pallet at that bias potential for as long as the pallet remains in the process chamber. A different bias potential may be applied to the pallet via a second rail only when the pallet is able to move across a space not provided with a potential rail, provided the non-rail space has a length equal to or greater than the length of the pallet.

According to one approach for application of optimal bias potentials in in-line, multi-cathode systems, adjacent cathodes for sputter deposition of different constituent layers of magnetic and/or magneto-optical (MO) recording media, e.g., the Cr cathode for deposition of the polycrystalline underlayer and the cathode for deposition of the magnetic recording layer, are spaced apart a pallet-length (more specifically, a standard chamber-length) in order to allow for application of separate bias potentials for each of the layers.

However, such approach disadvantageously requires long chamber lengths, increased pumping capacity and system footprint or area, as well as substantially increased cost. Moreover, recent improvements in recording media design have necessitated an increase in the number of thin film layers to be deposited as part of the multi-layer stack, and as a consequence, additional cathodes have been installed in the chamber, e.g., between the previously well-spaced cathodes for Cr and magnetic recording layer deposition, in turn necessitating deposition of all of the films or layers at the same substrate bias potential. For example, typical recent media designs require deposition of 7–9 distinct layers, and future superlattice-based media will require as many as 50 separate layers. In either instance, separation of adjacent cathodes by a pallet length to provide optimum bias potentials is clearly impractical in terms of cost and system size, and the alternative of continuing to process pallets at less than optimum bias potentials is similarly unattractive, in that the attendant loss of media performance may be as high as several dB in SMNR.

Accordingly, there exists a need for improved means and methodology for forming, as by plasma treatment or physical vapor deposition techniques, e.g., sputtering, under optimal substrate bias potentials and at processing rates consistent with the throughput requirements of automated manufacturing processing, multi-layer thin film stacks and laminates on the surfaces of a plurality of substrates carried by a common pallet, which means and methodology overcomes the above-described drawbacks associated with the difficulty in applying a desired, i.e., optimal, substrate bias during deposition of each constituent layer of the stack. More specifically, there exists a need for improved means and methodology for bias sputtering high purity, high quality, thin film layer stacks or laminates having optimal physical, chemical, and/or mechanical properties for use in the manufacture of single- and/or dual-sided magnetic and/or MO media, e.g., in the form of disks, which means and methodology provide rapid simple, and cost-effective formation of such media, as well as various other products and manufactures comprising a stack or laminate of thin film layers.

In particular, the present invention addresses and solves problems attendant upon performing bias sputter deposition of a plurality of thin film layers onto optimally electrically biased workpieces, which thin film deposition is utilized, inter alia, in the manufacture of high quality, thin film magnetic and/or magneto-optical (MO) recording media, while maintaining full compatibility with all aspects of conventional automated manufacturing technology therefor. Further, the means and methodology afforded by the present invention enjoy diverse utility in the manufacture of various devices and articles requiring high purity, high quality thin films with optimal physical, chemical, and/or mechanical properties.

DISCLOSURE OF THE INVENTION

An advantage of the present invention is an improved pallet for transporting a plurality of workpieces/substrates through an apparatus adapted for performing at least one treatment of at least one surface of each of the workpieces/substrates.

Another advantage of the present invention is an improved pallet for selectively and controllably applying electrical bias potentials to selected pluralities of workpieces/substrates transported through an apparatus adapted for performing a plurality of treatments of at least one surface of each of the workpieces/substrates.

A further advantage of the present invention is an improved apparatus for performing a plurality of treatments of at least one surface of each of a plurality of workpieces/substrates.

A still further advantage of the present invention is an improved apparatus for performing a plurality of treatments of at least one surface of each of a plurality of workpieces/substrates, comprising an improved pallet for selectively and controllably applying electrical bias potentials to various pluralities of workpieces/substrates.

Yet another advantage of the present invention is an improved method of treating a plurality of substrates.

Still another advantage of the present invention is an improved method of treating a plurality of substrates, utilizing an in-line treatment apparatus comprising an improved pallet for selectively and controllably applying electrical bias potentials to various pluralities of workpieces/substrates.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by a pallet for transporting a plurality of workpieces/substrates through an apparatus adapted for performing a plurality of treatments of at least one surface of each of the workpieces/substrates, comprising:
  a plurality of electrically conductive segments arranged in an array, each of the segments:
    i. being electrically insulated from other segments;
    ii. adapted to mount thereon and expose at least one major surface of a plurality of workpieces/substrates for receipt of a plurality of treatments; and
    iii. including an electrical contact means for providing electrical contact with a bias potential source of the apparatus.

In accordance with embodiments of the present invention, the electrical contact means is adapted for providing sliding electrical contact with the bias potential source; and each of the segments comprises a substantially flat, electrically conductive sheet, each of the sheets including a plurality of spaced-apart regions extending at least partway therethrough for mounting therein and exposing at least one major surface of each of the plurality of workpieces/substrates; and the sheets are arranged in a generally linearly extending array.

According to embodiments of the present invention, each of the regions comprises an aperture extending through a respective sheet for mounting therein and exposing oppositely facing pairs of major surfaces of respective workpieces/substrates for receipt of the plurality of treatments.

In accordance with certain embodiments of the invention, each of the apertures is substantially circularly-shaped and adapted for mounting a disk-shaped workpiece/substrate therein; each of the sheets has a length dimension defined by respective top and bottom edges and a width dimension defined by respective left and right side edges; and the apertures are arranged in columns extending along the length dimension of each sheet.

According to particular embodiments of the present invention, each of the sheets is rectangularly-shaped with the length dimension being greater than the width dimension; the rectangularly-shaped sheets are arranged in a linearly extending, parallel array; the columns of apertures are arranged in parallel; adjacent pairs of sheets are spaced-apart and maintained in the array by electrical insulation means; which electrical insulation means include shielding means for providing shielding from deposition thereon during use of the pallet in the treatment apparatus.

In accordance with further embodiments of the present invention, the electrical contact means is located at the bottom edge of the sheet and has a length not greater than the width dimension between the left and right side edges.

Another aspect of the present invention is an apparatus for performing a plurality of treatments of at least one surface of each of a plurality of workpieces/substrates, comprising:
  (a) a plurality of linearly spaced-apart treatment stations for performing a corresponding plurality of treatments of the at least one surface of each of the workpieces/substrates;
  (b) a pallet adapted for mounting the plurality of workpieces/substrates, the pallet comprising a plurality of electrically conductive segments arranged in an array, each of the segments:
    i. being electrically insulated from other segments;
    ii. adapted to mount thereon and expose at least one major surface of a plurality of workpieces/substrates for receipt of a plurality of treatments; and
    iii. including an electrical contact means for providing electrical contact with a bias potential source of the apparatus;
  (c) a plurality of bias potential sources; and
  (d) means for transporting the pallet past the plurality of treatment stations.

According to embodiments of the present invention, each of the electrical contact means is adapted for providing sliding electrical contact with the bias potential sources; and each of the segments comprises a substantially flat, electrically conductive sheet, each of the sheets including a plurality of spaced-apart regions extending at least partway therethrough for mounting therein and exposing at least one major surface of each of the plurality of workpieces/substrates; and the sheets are arranged in a generally linearly extending array.

In accordance with embodiments of the present invention, each of the regions comprises an aperture extending through a respective sheet for mounting therein and exposing oppositely facing pairs of major surfaces of respective workpieces/substrates for receipt of the plurality of treatments.

According to particular embodiments of the present invention, each of the apertures is substantially circularly-shaped and adapted for mounting a disk-shaped workpiece/substrate therein; each of the sheets has a length dimension defined by respective top and bottom edges and a width dimension defined by respective left and right side edges; and the apertures are arranged in columns extending along the length dimension of each sheet.

In accordance with certain embodiments of the present invention, each of the sheets is rectangularly-shaped with the length dimension being greater than the width dimension; the rectangularly-shaped sheets are arranged in a linearly extending, parallel array; and the columns of apertures are arranged in parallel.

According to further embodiments of the invention, adjacent pairs of sheets are spaced-apart and maintained in the array by electrical insulation means; and the electrical insulation means include shielding means for providing shielding from deposition thereon during use of the pallet in the treatment apparatus.

In accordance with still further embodiments of the present invention, the electrical contact means is located at the bottom edge of the sheet and has a length approximately equal to a width dimension of each of the treatment stations and not greater than the width dimension of the sheets between the left and right side edges; and adjacent ones of the plurality of treatment stations are linearly spaced apart by an amount greater than the width dimension of the sheets between the left and right side edges.

According to particular embodiments of the present invention, the treatment stations are selected from among physical vapor deposition (PVD) stations, e.g., sputter deposition stations, and plasma treatment stations.

Yet another aspect of the present invention is a method of processing at least one surface of a plurality of workpieces, comprising steps of:
  (a) mounting a plurality of workpieces on a pallet comprising a plurality of electrically insulated segments each comprised of an electrically conductive material; and
  (b) processing at least one surface of each of the workpieces at each of a plurality of treatment stations of an in-line apparatus, the processing comprising:
    (i) transporting the pallet successively past the plurality of treatment stations;
    (ii) applying to each electrically insulated segment of the pallet transported past a treatment station a pre-selected bias potential during an interval in which the segment is transported past the treatment station for treatment thereat; and
    (iii) treating workpieces mounted on the segment of the pallet.

According to embodiments of the invention, step (a) comprises providing a pallet comprising a plurality of electrically conductive segments arranged in a linearly extending array, each of the segments:
  being electrically insulated from other segments;
  adapted to mount thereon and expose at least one major surface of a plurality of workpieces/substrates for receipt of a plurality of treatments; and
  including an electrical contact means for providing electrical contact with a bias potential source of the apparatus.

In accordance with embodiments of the present invention:
  step (b) comprises providing an in-line apparatus comprising at least a pair of adjacent, linearly spaced-apart treatment stations, the pallet being linearly elongated and comprising at least first and second adjacent segments which span at least the pair of adjacent treatment stations;
  step (b)(i) comprises transporting the pallet through the in-line apparatus such that workpieces mounted on the first segment receive treatment at a second treatment station of the pair of treatment stations while workpieces mounted on the second segment simultaneously receive treatment at a first treatment station of the pair of treatment stations; and
  step (b)(ii) comprises applying a first bias potential to the workpieces mounted on the second segment during the interval in which the second segment receives treatment at the first treatment station, and applying a second bias potential to the workpieces mounted on the first segment during the interval in which the first segment receives treatment at the second treatment station.

According to certain embodiments of the present invention, step (b)(ii) comprises providing zero bias potential at at least one treatment station; and step (b)(iii) comprises performing a treatment selected from among physical vapor deposition (PVD), e.g., sputter deposition, and plasma treatment.

According to particular embodiments of the invention, step (a) comprises providing a pallet wherein each segment thereof is adapted for mounting a plurality of disk-shaped workpieces, such that the pairs of opposing major surfaces thereof are exposed for treatment at each of the plurality of treatment stations, each of the plurality of linearly spaced-apart treatment stations being adapted for treating both major surfaces of each of the plurality of disk-shaped workpieces.

In accordance with certain preferred embodiments of the present invention, step (a) comprises mounting a plurality of disk-shaped workpieces on each of the segments of the pallet, each of the workpieces comprising a substrate for a dual-sided, multi-layer, thin-film magnetic or magneto-optical (MO) recording medium; and step (b)(iii) comprises sputter depositing respective thin-film layers of the recording medium on both major surfaces of each of the plurality of disk-shaped workpieces.

Still another aspect of the present invention is an apparatus comprising:

(a) a pallet for mounting/transporting a plurality of workpieces/substrates; and (b) means for separately applying electrical bias potentials to electrically insulated, conductive segments of the pallet during transport thereof past a plurality of treatment stations of the apparatus.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, and in which like reference numerals are employed throughout to designate similar features, wherein.

DESCRIPTION OF THE INVENTION

Figure 1A:
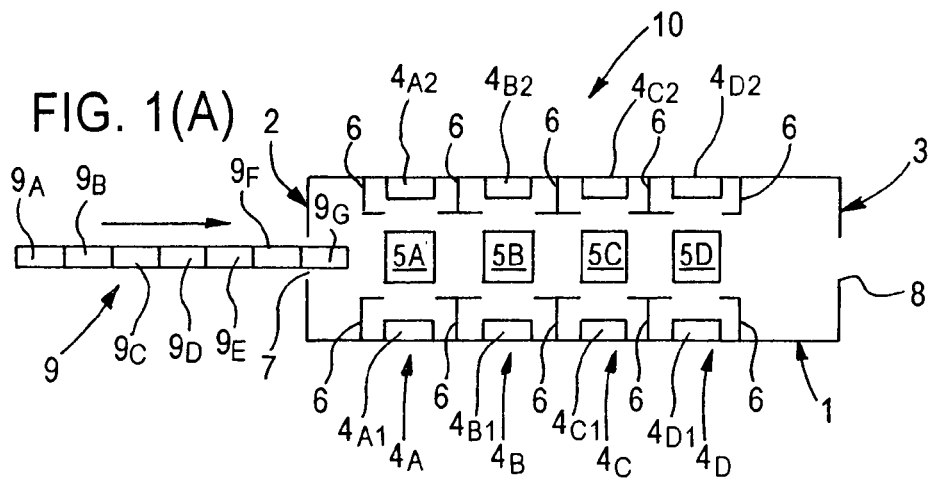
FIGS. 1(A)–1(E) are simplified, schematic cross-sectional top views illustrating several sequential stages in the operation of an illustrative, but not limitative, embodiment of an in-line, pass-by apparatus for treating opposing surfaces of a plurality of vertically mounted workpieces/substrates utilizing a segmented pallet according to the present invention.
Figure 1B:
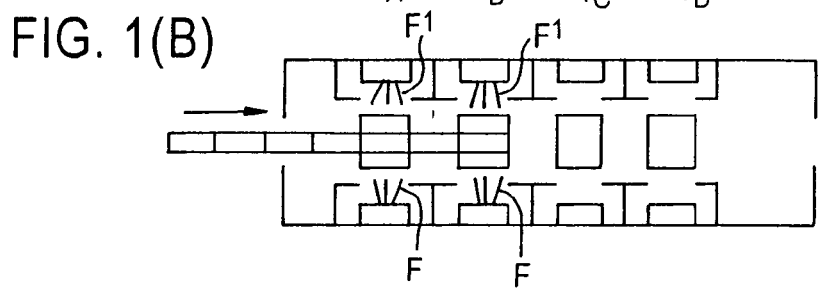

The present invention is based upon recognition by the inventor that the above-described limitations, disadvantages, and drawbacks imposed by the use of conventional in-line, multi-station processing apparatus comprised of a serially arranged plurality of different treatment stations in a single chamber, and elongated pallets for mounting and transporting a plurality of workpieces/substrates past the plurality of serially arranged treatment stations, wherein optimal treatment of the workpieces/substrates at each station requires application thereto of a pre-selected bias potential for that station, can be overcome by utilizing pallets comprised of a plurality of electrically insulated segments each comprised of an electrically conductive material, and providing each treatment station of the apparatus with a means for applying a pre-selected bias potential contact means which electrically contacts a segment of the pallet during the interval in which that segment is transported through the respective treatment station in its path through the chamber comprising the plurality of serially arranged treatment stations.

According to the invention, each of the plurality of electrically isolated segments of the pallet is provided with an electrical contact means at an end thereof, e.g., at a lower or bottom end, for making sliding electrical contact with a bias potential contact means of each treatment station, and the in-line apparatus is structured such that adjacent treatment stations are spaced apart by a distance equal to the width of the electrical contact means plus a small safety margin, whereby pre-selected, optimum bias potentials are separately applied to each of the pallet segments as each segment is transported past each treatment source. As a consequence of the inventive apparatus and methodology, optimum bias potentials for each treatment are simultaneously applied to workpieces/substrates on different segments of the pallet simultaneously receiving different treatments during their transport/passage through the multi-treatment station chamber.

Referring now to FIGS. 1(A)–1(E), shown therein, are simplified, schematic cross-sectional top views exemplifying several sequential stages in the operation of an illustrative, but not limitative, embodiment of an in-line, pass-by apparatus according to the invention for performing a plurality of treatments, e.g., plasma treatment or physical vapor deposition (PVD), such as sputter deposition, of/onto opposing surfaces of a plurality of vertically mounted workpieces/substrates according to the present invention, which apparatus can, if desired, form part of a larger, in-line system for continuous, automated manufacture of, e.g., magnetic and/or magneto-optical (MO) recording media such as hard disks, and wherein a plurality of certically oriented workpieces/substrates (e.g., disks) are transported in a linear path past a plurality of treatment stations located within a common chamber, for performing sequential treatments of at least one surface of each of the plurality of workpieces/substrates, e.g., sputter deposition of the various layers of a multi-layer, thin-film magnetic or MO recording medium.

More specifically, apparatus 10, as illustrated in FIGS. 1(A)–1(E), comprises a linearly elongated chamber 1, e.g., a vacuum chamber, interconnected at opposite entrance and exit ends 2 and 3, respectively, to various upstream and downstream chambers, such as buffer/isolation, pre-treatment, and post-treatment chambers (not shown in the drawing for illustrative simplicity), and including a plurality of spaced-apart treatment stations or sub-chambers in an in-line arrangement. By way of illustration, but not limitation, chamber 1 includes four treatment stations $4_A$, $4_B$, $4_C$, and $4_D$, each comprising at least one treatment source, preferably a pair of spaced-apart, oppositely facing, linearly elongated treatment sources $4_{A1}$, $4_{A2}$, $4_{B1}$, $4_{B2}$, $4_{C1}$, $4_{C2}$, $4_{D1}$, and $4_{D2}$, which treatment sources are selected from among a variety of physical vapor deposition sources, such as vacuum evaporation, sputtering (including magnetron sputtering), ion plating, etc., sources; and or from a variety of plasma or ion treatment sources, such as sputter/ion etching, hydrogen, nitrogen, argon, etc., plasma treatment sources) for performing simultaneous treatment of both sides of dual-sided workpieces (e.g., disk-shaped substrates for magnetic and/or MO recording media). The bottom wall of chamber 1 at each treatment station $4_A$, $4_B$, $4_C$, and $4_D$ is provided with a respective electrical contact $5_A$, $5_B$, $5_C$, and $5_D$ insulated therefrom, for providing pallet-mounted substrates passing each treatment station $4_A$, $4_B$, $4_C$, and $4_D$ with a pre-selected, optimum bias potential (from a source or sources not shown in the drawing figures for illustrative simplicity), each bias potential being selected from among DC, AC, and RF potentials, and combinations thereof. Alternatively, one or more of treatment stations $4_A$, $4_B$, $4_C$, and $4_D$ may be operated without application of a substrate bias potential to the respective electrical contact $5_A$, $5_B$, $5_C$, and $5_D$. A plurality of baffles 6 may, if desired, be provided at the ends of the first and last treatment stations (illustratively stations $4_A$ and $4_D$) and between adjacent pairs of treatment stations (illustratively between stations $4_A$ and $4_B$, stations $4_B$ and $4_C$, and stations $4_C$ and $4_D$) for limiting mixing of treatments or particles from adjacent sources, i.e., sputtering cathodes. The opposite lateral ends of chamber 1 are provided with entrance and exit openings 7 and 8, respectively, for introducing and withdrawing an elongated workpiece/substrate pallet 9 for performing multiple treatments of at least one surface of each of a plurality of substrates mounted thereon while being transported through chamber 1 of in-line treatment apparatus 10.

Figure 2:
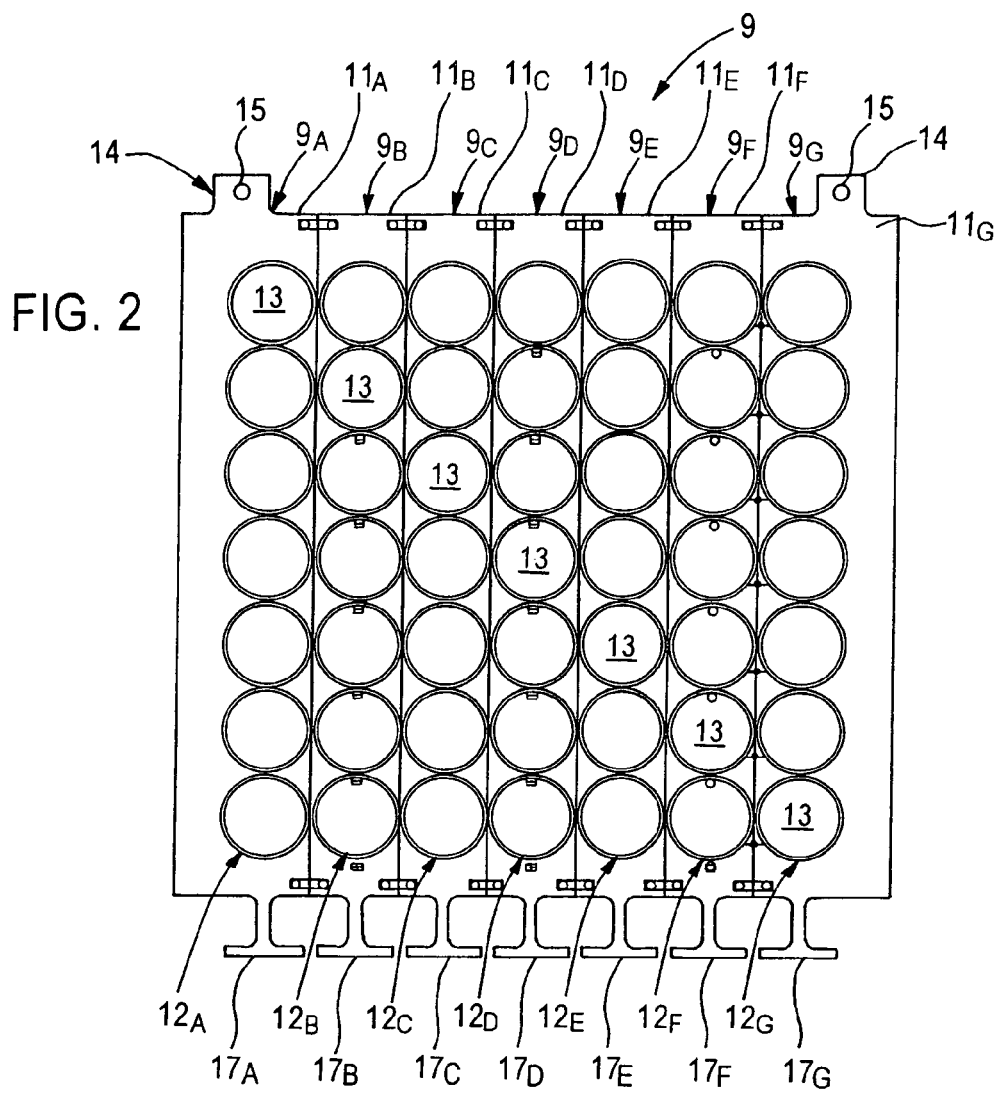
FIG. 2 is a simplified, schematic side view of a segmented pallet according to the invention, adapted for mounting and transporting a plurality of vertically oriented, disk-shaped workpieces/substrates, for use in the in-line apparatus of FIGS. 1(A)–1(E)

Adverting to FIG. 2, according to an illustrative, but not limitative, embodiment of the invention, workpiece/substrate pallet 9 comprises a plurality of generally rectangularly-shaped, electrically insulated segments, illustratively 7 segments $9_A$, $9_B$, $9_C$, $9_D$, $9_E$, $9_F$, and $9_G$, each having a width dimension defined by their respective left and right side longer edges and a length dimension defined by their respective top and bottom shorter edges, segments $9_A$–$9_G$ each being comprised of a respective sheet $11_A$–$11_G$ of electrically conductive material, e.g., an Al or an Al-based alloy sheet about 0.25" thick, and including a plurality of generally circularly-shaped apertures extending therethrough and adapted for mounting respective pluralities $12_A$–$12_G$ of workpieces in the form of disk-shaped substrates 13 arrayed in vertically extending columns as, for example, shown and disclosed in U.S. Pat. No. 5,814,196 to Hollars, et al., the entire disclosure of which is incorporated herein for all purposes. Pallet 9 further includes a pair of extensions 14 at the opposite upper edges thereof, each including a hole 15 for attachment of pallet 9 to a linear transport mechanism (of conventional design not described or shown herein for brevity and illustrative simplicity) for moving the pallet into, through, and out of chamber 1 of apparatus 10 via entrance and exit openings 7, 8, respectively, for performing multiple treatments of the oppositely facing surfaces of each of substrates 13. The pairs of facing edges of adjacent segments, i.e., $9_A$–$9_B$; $9_B$–$9_C$; $9_C$–$9_D$; $9_D$–$9_E$; $9_E$–$9_F$; and $9_F$–$9_G$ are spaced apart by insulator means 16 located near the top and bottom edges of the sheets, proximate the pairs of facing edges. As shown in more detail in FIG. 3, insulator means 16 comprises Al bars for maintaining the spacing between adjacent segments, which bars are mounted to the segments via fasteners which are insulatingly spaced from the respective segments by insulator means, e.g., rubber grommets, which arrangement advantageously shields the insulator means from deposition thereon of electrically conductive material, thereby preventing loss of electrical isolation between adjacent pallet segments.

Figure 3:
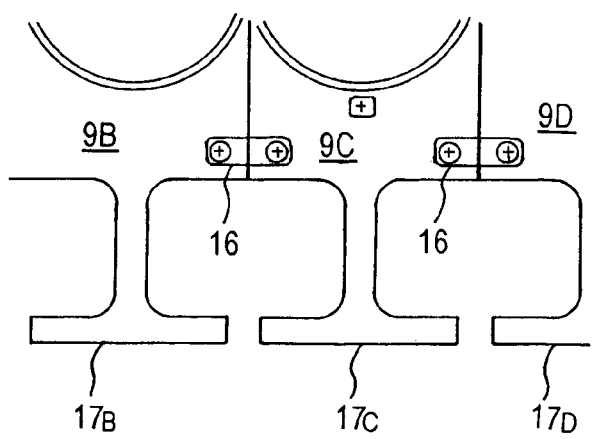
FIG. 3 is a simplified, schematic, enlarged view of a portion of the segmented pallet of FIG. 2.

Still referring to FIGS. 2 and 3, each pallet segment $9_A$, $9_B$, $9_C$, $9_D$, $9_E$, $9_F$, and $9_G$ is integrally or separately provided, at the lower edge thereof, with a respective bias rail contactor $17_A$, $17_B$, $17_C$, $17_D$, $17_E$, $17_F$, and $17_G$, adapted for making sliding electrical contact with one of the electrical contacts $5_A$, $5_B$, $5_C$, and $5_D$ of respective treatment stations $4_A$, $4_B$, $4_C$, and $4_D$ for applying a pre-selected bias potential thereto as pallet 9 moves through chamber 1 past successive treatment stations. According to the invention, each bias rail contactor $17_A$–$17_G$ has a length approximately equal to the width of each of the treatment sources $4_{A1}$, $4_{A2}$, $4_{B1}$, $4_{B2}$, $4_{C1}$, $4_{C2}$, $4_{D1}$, and $4_{D2}$ (e.g., sputtering cathodes) of treatment stations $4_A$, $4_B$, $4_C$, and $4_D$. Alternatively stated, according to the invention, adjacent treatment sources are separated from each other by a distance equal to the length of each of the bias rail contactors $17_A$–$17_G$ plus a small safety margin.

Returning to FIGS. 1(A)–1(E), illustrated therein are several (but not all) stages in the operation of apparatus 10 of the invention together with a segmented pallet 9 according to the invention which comprises 7 similarly-dimensioned, electrically isolated, conductive segments $9_A$, $9_B$, $9_C$, $9_D$, $9_E$, $9_F$, and $9_G$. In a first illustrative stage, shown in FIG. 1(A), leading segment $9_G$ of pallet 9 is shown as entering chamber 1 of in-line, multi-treatment station apparatus 10 via entrance opening 7 in entrance end 2. In the stage illustrated in FIG. 1(B), workpieces/substrates (13) carried by leading segment $9_G$ are shown as having completed treatment in the first treatment station $4_A$ and transported into the second treatment station $4_B$ for treatment thereat (as evidenced by sputtered particle fluxes F and F' emanating from treatment sources $4_{B1}$ and $4_{B2}$, respectively), with a pre-selected bias potential applied thereto via electrical contact $5_B$ of treatment station $4_B$ and bias rail contact $17_G$ of pallet segment $9_G$. Simultaneously therewith, workpieces/substrates carried by pallet segment $9_F$ are subjected to treatment by sources $4_{A1}$, and $4_{A2}$ in first treatment station $4_A$ (as evidenced by sputtered particle fluxes F and F' emanating from treatment sources $4_{A1}$ and $4_{A2}$, respectively), with a pre-selected bias potential applied thereto via electrical contact $5_A$ of treatment station $4_A$ and bias rail contact $17_F$ of pallet segment $9_F$.

Figure 1C:
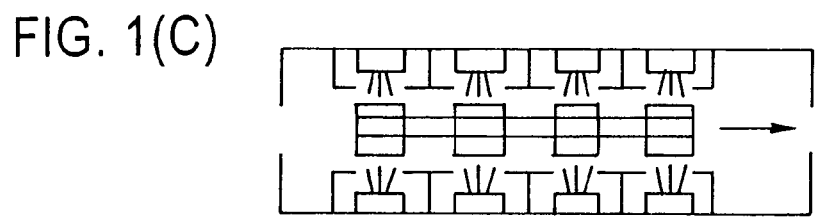
Figure 1D:
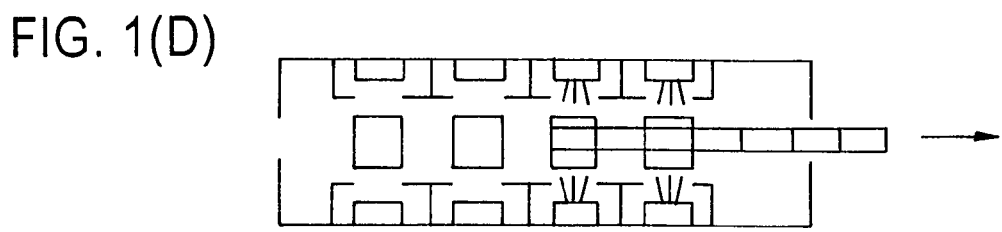
Figure 1E:
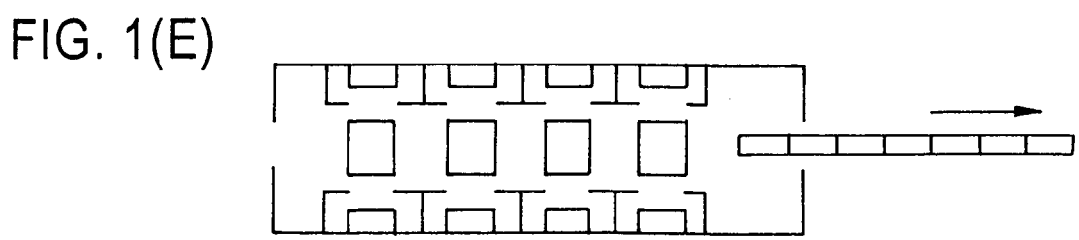

FIG. 1(C) illustrates a further stage wherein pallet 9 has fully entered into chamber 1 of apparatus 10, at which time workpieces/substrates carried by 4 pallet segments $9_G$, $9_E$, $9_C$, and $9_A$ receive respective treatments at treatment stations $4_D$, $4_C$, $4_B$, and $4_A$, respectively, with respective bias voltages applied thereto via electrical contacts/bias rail contact combinations $5_D/17_G$, $5_C/17_E$, $5_B/17_C$, and $5_A/17_A$. FIG. 1(D) illustrates a still further stage where the leading end of pallet has exited chamber 1 via exit opening 8 in exit wall 3 and only workpieces/substrates (13) carried by pallet segments $9_C$ and $9_A$ at the trailing end of pallet 9 remain in chamber 1 for receiving respective treatment in treatment stations $4_D$ and $4_C$, with respective bias voltages applied thereto via electrical contacts/bias rail contact combinations $5_D/17_C$ and $5_C/17_A$. FIG. 1(E) illustrates a terminal stage where each pallet segment $9_A$–$9_G$ has received treatment in each of treatment stations $4_A$–$4_D$ and pallet 9 has completely exited chamber 1.

According to a preferred embodiment of the present invention of particular utility in the manufacture of disk-shaped magnetic and/or MO recording media, the workpieces/substrates 13 carried by each of the pallet segments are in the form of annular disks, with inner and outer diameters corresponding to those of conventional hard-disk magnetic and/or MO media, and each of the illustrated treatment stations $4_A$–$4_D$ of apparatus 10 is provided with a pair of oppositely facing, linearly extending magnetron sputtering sources, for depositing respective constituent thin films of the multi-layer media on each surface of the plurality of disk-shaped substrates carried by the segmented pallet 9, with each constituent thin film having been deposited at an optimum substrate bias.

The invention provides for numerous configuration options for the plurality of sputtering cathodes, as follows:

the width of each of the sputtering cathodes can be reduced, thereby facilitating deposition of more layers in chambers of fixed length. For example, standard four 5" wide sputtering cathodes may be replaced with five 2" wide cathodes, thereby permitting deposition of 5 different layers at separate bias potentials, compared to 4 different layers deposited in the same chamber at a common bias potential;

the spacing between adjacent cathodes may be increased, while maintaining their width, thereby allowing each pallet segment (column) to clear each cathode after deposition thereon and assume the bias potential required for deposition of the succeeding layer. Thus, according to this configuration, 3 layers may be sputter deposited at 3 respective (i.e., different) bias potentials in the same chamber length as deposition of 4 layers at the same bias potential;

a plurality of spaced-apart, narrow width sputtering cathodes may be provided in the chamber, but less than the full plurality operated for a given manufacturing process. For example, nine (9) 2" cathodes may be provided but only 5 operated for a given process requiring deposition of 5 layers, thereby allowing for an alternative process involving operation of the 4 remaining cathodes for deposition of 4 layers;

the widths of each of the sputtering cathodes may be selected (i.e., varied) for deposition of layers with different thicknesses.

The inventive apparatus and method enjoys particular utility in the manufacture of multi-layer, thin-film magnetic and/or MO recording media, wherein the manufacturing process involves deposition and/or treatment steps requiring application of an electrical bias to the media workpiece/substrate for obtaining desired film or media properties. The inventive apparatus advantageously eliminates the requirement for separate chambers when sputter depositing multi-layer structures at optimal substrate bias potential for each layer. In addition, the inventive methodology enjoys full compatibility with all other aspects of automated magnetic and MO media manufacture and the inventive concept is broadly applicable to the manufacture of a variety of different products, e.g., coated architectural glass and optical coatings.

In the previous description, numerous specific details are set forth, such as specific materials, structures, processes, etc., in order to provide a better understanding of the present invention. However, the present invention can be practiced without resorting to the details specifically set forth. In other instances, well-known processing materials, structures, and techniques have not been described in detail in order not to unnecessarily obscure the present invention.

Only the preferred embodiments of the present invention and but a few examples of its versatility are shown and described in the present invention. It is to be understood that the present invention is capable of use in various other embodiments and is susceptible of changes and/or modifications within the scope of the inventive concept as expressed herein.

What is claimed is:

1. A pallet for mounting and transporting a plurality of disk-shaped workpieces/substrates through an apparatus adapted for performing a plurality of treatments of at least one surface of each of said disk-shaped workpieces/substrates, comprising:

a plurality of electrically conductive segments arranged in an array, each of said segments:
   i. being electrically insulated from other segments;
   ii. and used to mount thereon and expose at least one major surface of a plurality of disk-shaped workpieces/substrates for receipt of a plurality of treatments; and
   iii. including an electrical contact means for providing electrical contact with a bias potential source of said apparatus,
   wherein each of said segments comprises an electrically conductive sheet, each of said sheets including a plurality of spaced-apart regions each comprising an aperture extending through a respective sheet adapted for mounting said disk-shaped workpieces/substrates therein and exposing oppositely facing pairs of major surfaces of respective disk-shaped workpieces/substrates.

2. The pallet as in claim 1, wherein:
said electrical contact means is used for providing sliding electrical contact with said bias potential source.

3. The pallet as in claim 1, wherein:
each of said segments comprises a substantially flat, electrically conductive sheet, each of said sheets including a plurality of said spaced-apart regions extending at least partway therethrough for mounting therein and exposing a said at least one major surface of each of said plurality of disk-shaped workpieces/substrates; and said sheets are arranged in a generally linearly extending array.

4. The pallet as in claim 1, wherein:
each of said apertures is substantially circularly-shaped and adapted for mounting a disk-shaped workpiece/substrate therein.

5. The pallet as in claim 1, wherein:
each of said sheets has a length dimension defined by respective top and bottom edges and a width dimension defined by respective left and right side edges; and
said apertures are arranged in columns extending along the length dimension of each sheet.

6. The pallet as in claim 5, wherein:
each of said sheets is rectangularly-shaped with said length dimension being greater than said width dimension;
said rectangularly-shaped sheets are arranged in a linearly extending, parallel array;
and said columns of apertures are arranged in parallel.

7. The pallet as in claim 6, wherein:
adjacent pairs of said sheets are spaced-apart and maintained in said array by electrical insulation means.

8. The pallet as in claim 7, wherein:
said electrical insulation means include shielding means for providing shielding from deposition thereon during use of said pallet in said treatment apparatus.

9. The pallet as in claim 5, wherein:
said electrical contact means is located at said bottom edge of said sheet and has a length not greater than said width dimension between said left and right side edges.

10. An apparatus for performing a plurality of treatments of at least one surface of each of a plurality of disk-shaped workpieces/substrates, comprising:
(a) a plurality of linearly spaced-apart treatment stations for performing a corresponding plurality of treatments of said at least one surface of each of said disk-shaped workpieces/substrates;
(b) a pallet adapted for mounting said plurality of disk-shaped workpieces/substrates, said pallet comprising a plurality of electrically conductive segments arranged in an array, each of said segments:
  i. being electrically insulated from other segments;
  ii. and used to mount thereon and expose at least one major surface of a plurality of disk-shaped workpieces/substrates for receipt of a plurality of treatments; and
  iii. including an electrical contact means for providing electrical contact with a bias potential source of said apparatus;
(c) a plurality of bias potential sources; and
(d) means for transporting said pallet past said plurality of treatment stations,
wherein each of said segments comprises an electrically conductive sheet, each of said sheets including a plurality of spaced-apart regions each comprising an aperture extending through a respective sheet adapted for mounting said disk-shaped workpieces/substrates therein and exposing oppositely facing pairs of major surfaces of respective disk-shaped workpieces/substrates.

11. The apparatus as in claim 10, wherein:
each of said electrical contact means is used for providing sliding electrical contact with said bias potential sources.

12. The apparatus as in claim 10, wherein:
each of said segments comprises a substantially flat, electrically conductive sheet, and said sheets are arranged in a generally linearly extending array.

13. The apparatus as in claim 12, wherein:
each of said apertures is substantially circularly-shaped and adapted for mounting a disk-shaped workpiece/substrate therein.

14. The apparatus as in claim 12, wherein:
each of said sheets has a length dimension defined by respective top and bottom edges and a width dimension defined by respective left and right side edges; and
said apertures are arranged in columns extending along the length dimension of each sheet.

15. The apparatus as in claim 14, wherein:
each of said sheets is rectangularly-shaped with said length dimension being greater than said width dimension;
said rectangularly-shaped sheets are arranged in a linearly extending, parallel array;
and said columns of apertures are arranged in parallel.

16. The apparatus as in claim 15, wherein:
adjacent pairs of said sheets are spaced-apart and maintained in said array by electrical insulation means.

17. The apparatus as in claim 16, wherein:
said electrical insulation means include shielding means for providing shielding from deposition thereon during use of said pallet in said treatment apparatus.

18. The apparatus as in claim 15, wherein:
said electrical contact means is located at said bottom edge of said sheet and has a length approximately equal to a width dimension of each of said treatment stations and not greater than said width dimension of said sheets between said left and right side edges.

19. The apparatus as in claim 18, wherein:
adjacent ones of said plurality of treatment stations are linearly spaced apart by an amount greater than said width dimension of said sheets between said left and right side edges.

20. The apparatus as in claim 10, wherein:
said treatment stations are selected from among physical vapor deposition (PVD) stations and plasma treatment stations.

21. The apparatus as in claim 20, wherein:
said PVD stations are sputter deposition stations.

* * * * *